United States Patent [19]

Strycula et al.

[11] 4,406,991

[45] Sep. 27, 1983

[54] HIGH POWER RESONANCE FILTERS

[75] Inventors: Eugene C. Strycula, Pittsburgh; Derek A. Paice, Murrysville; Laszlo Gyugyi, Pittsburgh, all of Pa.

[73] Assignee: Westinghouse Electric Corp., Pittsburgh, Pa.

[21] Appl. No.: 345,849

[22] Filed: Feb. 4, 1982

[51] Int. Cl.³ .......................... H03H 7/01; H03H 7/03
[52] U.S. Cl. .................................... 333/175; 363/47; 333/167; 333/181
[58] Field of Search ............... 333/167, 168, 175, 176, 333/181–185, 177–180; 363/39, 40, 42, 44, 45, 47, 48

[56] References Cited

U.S. PATENT DOCUMENTS 2,982,928  5/1961  Kall ..................................... 333/167
3,038,134  5/1962  Forssell .............................. 333/181
3,859,542  1/1975  Kennedy ......................... 333/175 X Primary Examiner—Marvin L. Nussbaum
Attorney, Agent, or Firm—Benjamin Hudson, Jr.

[57] ABSTRACT

There is provided by this invention a novel high power resonance filter utilizing a resistive element between two resonant branches disposed to dampen resonant harmonic currents or voltages while maintaining minimal losses at the fundamental frequency.

4 Claims, 5 Drawing Figures

HIGH POWER RESONANCE FILTERS

BACKGROUND OF THE INVENTION

1. Field of the Invention

This invention relates generally to high power filters for damping resonant harmonic voltage or current components in an a.c. network and more particularly for high power filters used in conjunction with static var generators applied to an a.c. network.

2. Description of the Prior Art

The use of static var generators in a.c. networks for power factor correction or system stability can sometimes result in an increase in harmonic currents due to resonance between the capacitors and the a.c. supply lines. In a resonant condition the magnitude of the resonant harmonic component (either voltage or current) may be several times larger than their normal harmonic values. These excessively high harmonic voltages or currents may result in serious damage to electrical equipment in the a.c. network.

Conventional filters usually consist of series resonant branches connected across the power lines. The filter and remaining ac system form a LCR netowrk which is characterized by "zeros" (low impedances) and "poles" (high impedances) at frequencies where series and parallel network resonances occur. The location of the dominant "zeros" are set by design in accordance with the principal harmonics to be filtered (2nd, 3rd, 4th, 5th) and are determined by the series resonance of the filter branches. The "poles" are dependent upon the filter and ac system and occur at intermediate frequencies. The magnitude of the poles is determined by the network resistance (losses) at the "pole" frequencies.

It is generally desirable that the magnitude of the impedance "poles" be low to prevent transient disturbances of the system from causing poorly damped oscillations at the "pole" frequencies. These oscillations would manifest themselves by oscillatory currents flowing in the filter network and ac system with corresponding voltages apparing on the utility bus. The oscillatory voltages on the utility bus can cause light flicker and other electrical disturbances to consumers supplied from the source utility bus. In large static var generator systems, it is also important that the "poles" be low to damp oscillations and thus to minimize ratings of the capacitors used in the filter network.

The magnitude of the impedance "poles" may be reduced by the addition of a damping resistor, normally connected either in series or parallel with the branch inductor, however, this produces several undesirable effects. Namely, (1) the "zero" impedance of the branch is increased, thereby reducing the attenuation of the desired harmonic voltage and (2) additional losses are introduced. These losses are due to a fundamental current component as well as current components produced at the parallel resonant "pole" frequencies flowing through the damping resistor.

The fundamental component of losses produced in resistive damping is particularly bothersome since it contributes nothing to the reduction of the "pole" impedances, but does consume real power from the utility system for which the equipment operator is charged. In higher order harmonic branches (4th and above) a moderate degree of reduction in the impedance poles can be achieved without excessive fundamental dissipation in the damping resistor. In lower order harmonic branches however moderate damping produces prohibitively high losses.

Numerous techniques are available for reducing the fundamental component of losses in the damping resistor while maintaining a low "zero" impedance of the filter branch. These techniques generally employ additional series resonant sections connected in parallel with the damping resistor as shown in FIG. 1 to, first, bypass the fundamental component of current, $I_{FM}$, thereby eliminating the fundamental component of losses in the resistor $R_N$ and, second, bypass the harmonic current, $I_N$, further reducing losses and lowering the "zero" impedance of the branch. While those techniques reduce losses and improve filtering, they are expensive, particularly in high power applications since additional LC sections are required.

SUMMARY OF THE INVENTION

There is provided by this invention a novel high power resonance filter utilizing a single resistive element connected between two series resonant filter branches, that reduces the dissipation of the fundamental frequency in the resistor, while providing a reduction in the resonant harmonic components

DESCRIPTION OF THE PREFERRED EMBODIMENT

Figure 1:
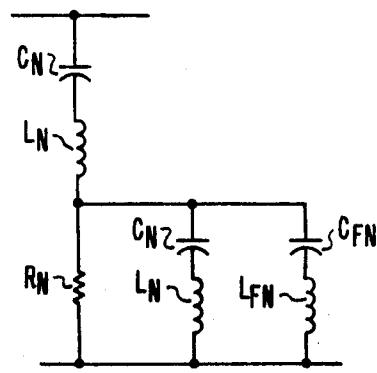
FIG. 1 is a conventional filter utilizing a damping resistor having low "zero" branch impedance.

Referring to FIG. 1, there is shown a conventional resonant filter arrangement to define some basic terminology used herein.

Figure 2:
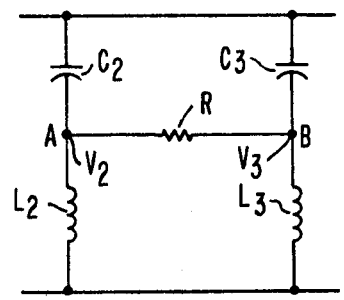
FIG. 2 is a filter using a single resistor connected between two series resonant branches incorporating the principles of this invention.

The novel arrangement incorporating the principles of this invention is presented in FIG. 2, illustrating a resistor, R, connected between the 2nd and 3rd harmonic branches of the filter at points A and B. In this arrangement the fundamental component of voltage across R is less than in the conventional case where the resistor is connected in parallel with $L_2$ because of the fundamental component of voltage appearing at point B. When applied to the 2nd and 3rd harmonic branches, this results in a 38 percent reduction in fundamental voltage across R and for the same R a 62 percent reduction in fundamental dissipation. While the arrangement shown in FIG. 2 is applied to the 2nd and 3rd harmonic branches, the technique is applicable between any two filter branches.

Qualitatively the damping effect on the "poles" adjacent to the 2nd and 3rd harmonic "zeros" is obtained as follows. In the conventional arrangement where the damping resistance is placed either in series or parallel with the branch inductance $L_2$, the greatest voltage across the resistor occurs at the resonant frequency of the branch to which it is connected. Thus the conventional techniques have their greatest effect on damping at the "zero" series resonant frequency.

In the proposed arrangement, the damping resistor has a much greater effect on the intermediate pole located between the 2nd and 3rd harmonics, with the lower (below the 2nd harmonic) and upper (above the 3rd harmonic) "poles" also effected. This occurs since the voltage across resistor R is numerically equal to $V_2-V_3$ for frequencies below the 2nd and above the 3rd harmonics, while for frequencies between these harmonics the voltage across the resistor increases, because of the phase change, to $V_2+V_3$. This increases the power available for damping at the intermediate pole.

In the basic arrangement shown in FIG. 2 a fundamental component of voltage still exists across the damping resistor and therefore real power is still consumed from the utility system. In high power applications a penalty is often imposed by the utility system on power conditioning equipment which consumes real power. By modifying the basic arrangement slightly the fundamental component of voltage across the resistor, and therefore the fundamental losses, can be eliminated completely. Two such arrangements are presented in FIGS. 3 and 4. Again while these arrangements are shown for resistive connections between the 2nd and 3rd harmonic branches, they may be applied between any two series resonant filter branches.

Figure 3:
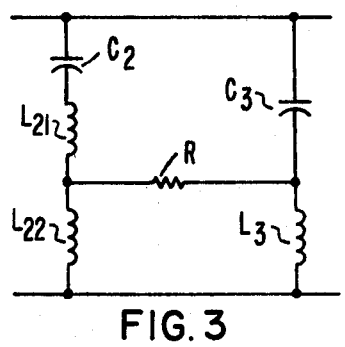
FIG. 3 is an alternate embodiment of the filter shown in FIG. 2 utilizing a split inductor scheme.

In FIG. 3, the branch inductor $L_2$ is divided into two inductors $L_{21}$ and $L_{22}$ such that (1) $L_2=L_{21}+L_{22}$ is resonant with the series capacitor $C_2$ at the 2nd harmonic frequency and (2) the fundamental component of voltage appearing on either side of resistor R is the same thereby reducing the fundamental voltage across resistor R to zero.

Figure 4:
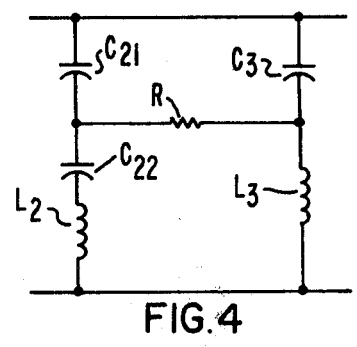
FIG. 4 is an alternate embodiment of the filter shown in FIG. 2 utilizing a split capacitor scheme.

Similarly in FIG. 4, the fundamental component of losses in resistor R are completely eliminated by dividing the capacitor $C_2$ into two capacitors $C_{21}$ and $C_{22}$ such that (1) $C_2=C_{21}C_{22}/(C_{21}+C_{22})$ is resonant with the branch inductance $L_2$ at the 2nd harmonic frequency and (2) the fundamental component of voltage across resistor R is zero.

In the arrangements shown in FIGS. 3 and 4, either the branch inductor $L_2$ or the branch capacitor $C_2$ is divided into two components so that a damping resistor connected between the two filter branches experiences no fundamental component of voltage across it. While this method does mean that an additional component is required, the power rating and therefore the cost of the two components is comparable to that of the single element. Depending upon the degree of damping required and the losses involved, it would be necessary in any particular application to determine whether the additional expense would be justified by the savings in real power consumption and penalty costs.

Figure 5:
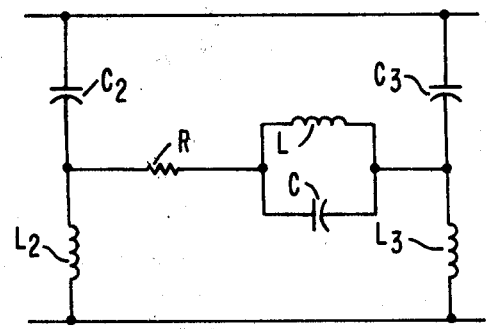
FIG. 5 is an alternate embodiment of the filter shown in FIG. 2 utilizing a parallel LC section in series with the resistive element.

An alternate method of reducing the fundamental dissipation in the damping resistor is to insert in series with R a parallel LC section resonant at the fundamental frequency as shown in FIG. 5. This section would produce a high impedance at the fundamental frequency, reducing the voltage across the damping resistor, thereby its fundamental dissipation.

It can readily be seen that there is provided by this invention a novel high power resonant filter that dampens resonant harmonic components while maintaining reduced losses at the fundamental frequency.

Although there have been illustrated and described a specific embodiment, it is clearly understood that the same were merely for purposes of illustration and that changes and modifications may be made therein by those skilled in the art without departing from the spirit and scope of this invention.

We claim:

1. A high power resonance filter, comprising:
   (a) a first resonant branch having a first series connected capacitive element and inductive element;
   (b) a second resonant branch having a second series connected capacitive element and inductive element;
   (c) a resistive branch connected at a junction of the first series connected capacitive element and inductive element and a junction of the second series connected capacitive element and inductive element between the first and second resonant branches;
   (d) the first resonant branches and second resonant branches having two common nodes to form a resonant filter network; and
   (e) the first resonant branches and second resonant branches having a common junction to an a.c. power network.

2. A high power resonance filter, comprising:
   (a) a first resonant branch having a series connected capacitive element and two inductive elements;
   (b) a second resonant branch having a series connected capacitive element and inductive element;
   (c) a resistive branch connected at a junction of the first two series connected inductive elements and a junction of the second series connected capacitive element and inductive element between the first and second resonant branches;
   (d) the first and second resonant branches having two common nodes to form a resonant filter network; and
   (e) the first and second resonant branches having a common junction to an a.c. power system.

3. A high power resonance filter, comprising:
   (a) a first resonant branch having a series connected inductive element and two capacitive elements;
   (b) a second resonant branch having a series connected inductive element and capacitive element;
   (c) a resistive branch connected at a junction of the first two series connected capacitive elements and a junction of the second series connected inductive element and capacitive element between the first and second resonant branches;
   (d) the first and second resonant branches having two common nodes to form a resonant filter network; and
   (e) the first and second resonant branches having a common junction to an a.c. power system.

4. A high power resonance filter as recited in claim 1, 2 or 3 wherein said resistive branch further comprises a parallel connected capacitive element and inductive element serially connected to the resistive element.

* * * * *